US011917776B2

(12) United States Patent
Qi et al.

(10) Patent No.: US 11,917,776 B2
(45) Date of Patent: Feb. 27, 2024

(54) ELECTRONIC DEVICE AND CONTROL METHOD FOR ELECTRONIC DEVICE

(71) Applicant: HuiZhou TCL Mobile Communication Co., Ltd., Guangdong (CN)

(72) Inventors: Qin Qi, Guangdong (CN); Yun Ye, Guangdong (CN); Zhengxian Huang, Guangdong (CN); Zhiguo Hu, Guangdong (CN)

(73) Assignee: HuiZhou TCL Mobile Communication Co., Ltd., HuiZhou (CN)

( * ) Notice: Subject to any disclaimer, the term of this patent is extended or adjusted under 35 U.S.C. 154(b) by 335 days.

(21) Appl. No.: 17/442,993

(22) PCT Filed: Nov. 8, 2019

(86) PCT No.: PCT/CN2019/116754
§ 371 (c)(1),
(2) Date: Sep. 24, 2021

(87) PCT Pub. No.: WO2021/027124
PCT Pub. Date: Feb. 18, 2021

(65) Prior Publication Data
US 2022/0183168 A1    Jun. 9, 2022

(30) Foreign Application Priority Data

Aug. 12, 2019   (CN) .......................... 201910737979.3

(51) Int. Cl.
*H05K 5/02* (2006.01)
*H05K 5/00* (2006.01)

(52) U.S. Cl.
CPC ......... *H05K 5/0217* (2013.01); *H05K 5/0017* (2013.01)

(58) Field of Classification Search
CPC .. H05K 5/0217; H05K 5/0017; G06F 1/1624; G06F 1/1615; G06F 1/1652; H04M 1/0235; H04M 1/0268
See application file for complete search history.

(56) References Cited

U.S. PATENT DOCUMENTS

2012/0212433 A1   8/2012  Lee et al.
2012/0314400 A1*  12/2012 Bohn .................. H04M 1/0237
                                                    361/679.01
(Continued)

FOREIGN PATENT DOCUMENTS

CN      107995989      5/2018
CN      109618033      4/2019
(Continued)

OTHER PUBLICATIONS

International Search Report and the Written Opinion dated Apr. 9, 2020 From the International Searching Authority Re Application No. PCT/CN2019/116754 and Its Translation of Search Report Into English. (9 Pages).

(Continued)

*Primary Examiner* — Abhishek M Rathod

(57) ABSTRACT

Provided in the present application are an electronic device and a control method for the electronic device. A shell in the electronic device is provided with a first face and a second face that are arranged opposite each other and a first side portion and a second side portion that are arranged opposite each other; a guide apparatus is received in the shell, and the guide apparatus can drive the second side portion to extend or retract; and a flexible display screen is arranged at an outer surface of the shell, and the side, located at the second face, of the flexible display screen is provided with an opening, and when the guide apparatus drives the second side portion to extent, the flexible display screen is split from (Continued)

the opening, and the flexible display screen moves from the second face to the first face along the guide apparatus.

18 Claims, 4 Drawing Sheets

(56) References Cited

U.S. PATENT DOCUMENTS

| | | | |
|---|---|---|---|
| 2013/0058063 A1* | 3/2013 | O'Brien | G06F 1/1624 361/807 |
| 2017/0064847 A1* | 3/2017 | Lim | G09F 9/30 |
| 2017/0140504 A1* | 5/2017 | Jeong | G06F 1/1677 |
| 2018/0011515 A1 | 1/2018 | Yoo et al. | |
| 2018/0014417 A1* | 1/2018 | Seo | H05K 7/20954 |
| 2018/0343754 A1* | 11/2018 | Lee | H05K 1/0283 |
| 2020/0168132 A1 | 5/2020 | Wu et al. | |
| 2021/0135492 A1* | 5/2021 | Kim | G06F 1/1624 |

FOREIGN PATENT DOCUMENTS

| | | |
|---|---|---|
| CN | 109743421 | 5/2019 |
| CN | 109819074 | 5/2019 |
| KR | 20120095019 | 8/2012 |
| WO | WO 2018/210196 | 11/2018 |

OTHER PUBLICATIONS

Notification of Office Action dated Mar. 3, 2020 From the State Intellectual Property Office of the People's Republic of China Re. Application No. 201910399878.X and Its Translation Into English. (14 Pages).

* cited by examiner receiving a control instruction comprising a sliding operation ~ 201 based on the sliding operation, controlling the supporting track to move and thereby make the flexible display screen move from the second face to the first face along the guiding component ~ 202

FIG. 6

ELECTRONIC DEVICE AND CONTROL METHOD FOR ELECTRONIC DEVICE

RELATED APPLICATIONS

This application is a National Phase of PCT Patent Application No. PCT/CN2019/116754 having International filing date of Nov. 8, 2019, which claims the benefit of priority of Chinese Patent Application No. 201910737979.3 filed on Aug. 12, 2019. The contents of the above applications are all incorporated by reference as if fully set forth herein in their entirety.

FIELD AND BACKGROUND OF THE INVENTION

The present application relates to communication technologies, and more particularly to an electronic device and a method for controlling an electronic device.

With social development, portable electronic devices are equipped with more and more functions. In an evolution from a full screen display to a display with foldable screen, the size of mobile phone screens has been increasing throughout the whole process, and it has become a trend to configure larger screens for electronic devices. Investigating the reasons behind, it can be seen that consumers, manufacturers and software developers all appreciate large mobile phone screens. This is because a large screen can present abundant multimedia content and a better experience on touch operations can be yielded.

It is also noticed that one thing remains unchanged when the screen size is getting larger and larger, that is, portability of the devices needs to be guaranteed while a visible area of a screen of the electronic device increases as much as possible. Nevertheless, the screen size of the existing electronic devices is usually fixed. A screen display profile cannot be changed as desired for the electronic devices of such a regular shape.

SUMMARY OF THE INVENTION

Embodiments of the present application provides an electronic device and a method for controlling the electronic device, which can change a screen display profile.

The present application provides an electronic device, including:
- a housing, having a first face and a second face that are disposed opposite to each other, and a first lateral portion and a second lateral portion that are disposed opposite to each other;
- a guiding component, housed inside the housing, wherein the guiding component is extendable for driving the second lateral portion to extend or retract;
- a flexible display screen, disposed on an external surface of the housing, wherein the flexible display screen has an opening at a side where the second face is located;
- a supporting track, disposed on the external surface of the housing, wherein the flexible display screen is disposed on the external surface of the supporting track, and in response to driving by the guiding component to extend the second lateral portion, the supporting track moves and thereby makes the flexible display screen move from the second face to the first face along the guiding component; and
- a processor, electrically connected to the supporting track, wherein in response to driving by the guiding component to extend the second lateral portion, the flexible display screen is split from the opening, and the processor controls the supporting track to move and thereby make the flexible display screen move from the second face to the first face along the guiding component.

In some embodiments, an extending state is formed after the guiding component is extended from the housing, the guiding component including a first connecting portion, a second connecting portion and a connecting board, and the connecting board is connected to the first connecting portion and the second connecting portion.

In some embodiments, a guiding slot is provided on the first connecting portion and the second connecting portion, and the supporting track is extended or retracted along the guiding slot.

In some embodiments, a splitting gap is provided on the supporting track, the splitting gap corresponds to the opening, and the supporting track is splitable through the opening.

In some embodiments, connecting members are provided on the supporting track at two sides of the splitting gap, and the connecting members are connected to each other in response to the guiding component retracted.

In some embodiments, the connecting members include a first magnetic element and a second magnetic element, the first magnetic element is disposed on the supporting track at one side of the splitting gap, and the second magnetic element is disposed on the supporting track at the other side of the splitting gap.

The present application provides an electronic device, including:
- a housing, having a first face and a second face that are disposed opposite to each other, and a first lateral portion and a second lateral portion that are disposed opposite to each other;
- a guiding component, housed inside the housing, wherein the guiding component is extendable for driving the second lateral portion to extend or retract;
- a flexible display screen, disposed on an external surface of the housing, wherein the flexible display screen has an opening at a side where the second face is located;
- wherein in response to driving by the guiding component to extend the second lateral portion, the flexible display screen is split from the opening and moves from the second face to the first face along the guiding component.

In some embodiments, a supporting track is provided on the external surface of the housing, and wherein the flexible display screen is disposed on the external surface of the supporting track, and in response to driving by the guiding component to extend the second lateral portion, the supporting track moves and thereby makes the flexible display screen move from the second face to the first face along the guiding component.

In some embodiments, an extending state is formed after the guiding component is extended from the housing.

In some embodiments, the guiding component including a first connecting portion, a second connecting portion and a connecting board, and the connecting board is connected to the first connecting portion and the second connecting portion.

In some embodiments, a guiding slot is provided on the first connecting portion and the second connecting portion, and the supporting track is extended or retracted along the guiding slot.

In some embodiments, a splitting gap is provided on the supporting track, the splitting gap corresponds to the opening, and the supporting track is splitable through the opening.

In some embodiments, connecting members are provided on the supporting track at two sides of the splitting gap, and the connecting members are connected to each other in response to the guiding component retracted.

In some embodiments, the connecting members include a first magnetic element and a second magnetic element, the first magnetic element is disposed on the supporting track at one side of the splitting gap, and the second magnetic element is disposed on the supporting track at the other side of the splitting gap.

In some embodiments, the electronic device further includes a driving mechanism, connected to the guiding component, wherein the driving mechanism drives the guiding component to extend or retract.

In some embodiments, an accommodating hole is disposed in the second lateral portion, and the accommodating hole is configured to accommodate a stylus.

An embodiment of the present application further provides a method for controlling an electronic device, applied to the electronic device, which includes a housing, a guiding component, a flexible display screen, a supporting track and a processor, wherein the housing has a first face and a second face that are disposed opposite to each other, and a first lateral portion and a second lateral portion that are disposed opposite to each other; the guiding component is housed inside the housing, and the guiding component is extendable for driving the second lateral portion to extend or retract; the flexible display screen is disposed on an external surface of the housing, and the flexible display screen has an opening at a side where the second face is located; the supporting track is disposed on the external surface of the housing, and the flexible display screen is disposed on the external surface of the supporting track, wherein the processor executes the steps of:

receiving a control instruction including a sliding operation; and
 based on the sliding operation, controlling the supporting track to move and thereby make the flexible display screen move from the second face to the first face along the guiding component.

In some embodiments, the sliding operation includes:
 sliding toward a predetermined direction from a predetermined position; and
 based on the sliding in a corresponding direction, obtaining the control instruction corresponding to the sliding of the corresponding direction.

In some embodiments, the sliding toward the predetermined direction from the predetermined position includes:
 sliding toward a first direction to obtain a first control instruction; and
 sliding toward a second direction to obtain a second control instruction.

In some embodiments, the sliding operation includes:
 sliding for a distance toward a predetermined direction from a predetermined position.

BRIEF DESCRIPTION OF THE SEVERAL VIEWS OF THE DRAWINGS

For explaining the technical solutions used in the embodiments of the present application more clearly, the appended figures to be used in describing the embodiments will be briefly introduced in the following. Obviously, the appended figures described below are only some of the embodiments of the present application, and those of ordinary skill in the art can further obtain other figures according to these figures without making any inventive effort.

FIG. 6 is a flowchart of a method for controlling an electronic device provided in an embodiment of the present application.

DESCRIPTION OF SPECIFIC EMBODIMENTS OF THE INVENTION

The technical solutions in the embodiments of the present application will be clearly and completely described below with reference to appended drawings of the embodiments of the present application. Obviously, the described embodiments are merely a part of embodiments of the present application and are not all of the embodiments. Based on the embodiments of the present application, all the other embodiments obtained by those of ordinary skill in the art without making any inventive effort are within the scope the present application.

An embodiment of the present application provides an electronic device, which will be described in detail below. The electronic device may be a smart phone, a smart computer, and etc.

Figure 1:
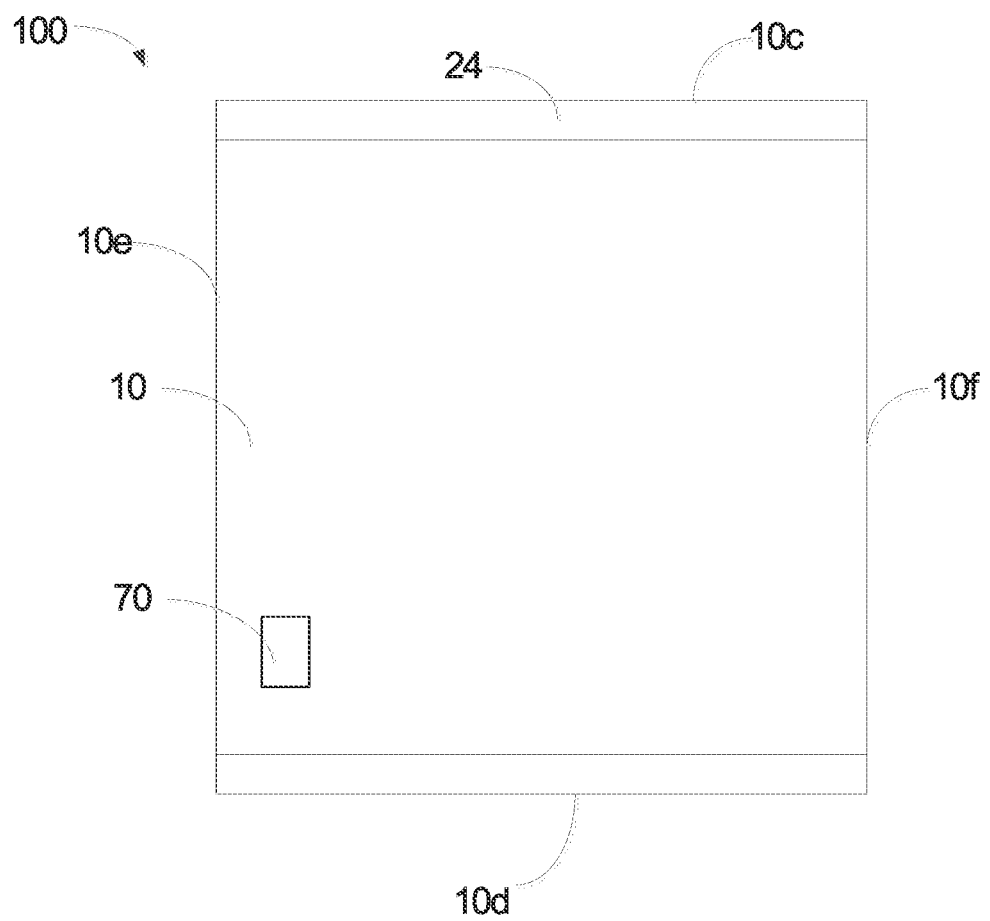
FIG. 1 is a top view of an electronic device provided in an embodiment of the present application.
Figure 2:
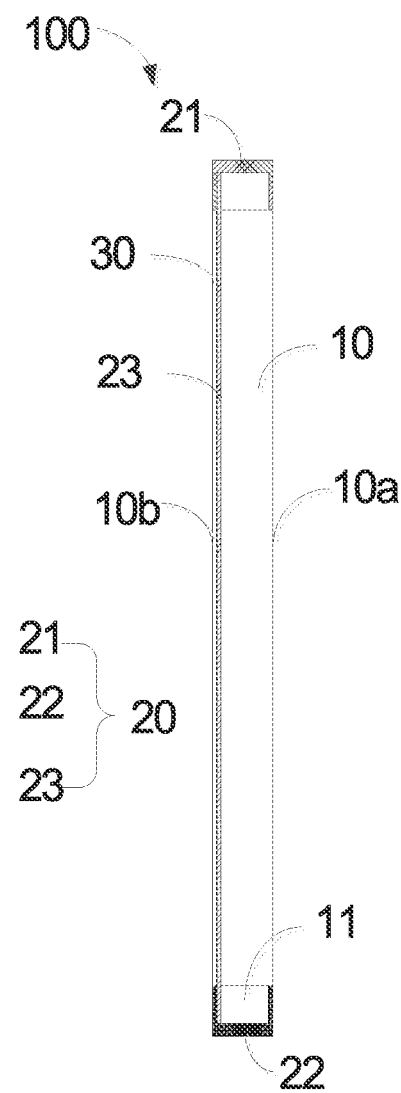
FIG. 2 is a side view of the electronic device provided in an embodiment of the present application.

FIG. 1 is a top view of an electronic device provided in an embodiment of the present application. FIG. 2 is a side view of the electronic device provided in an embodiment of the present application.

The electronic device 100 may include a housing 10, a guiding component 20, a flexible display screen 30 and a processor 70. It needs to be noted that the electronic device 100 is not limited to afore-mentioned components. The electronic device 100 may include more components, such as a camera, a circuit board, a sensor, and etc. In some embodiments, the camera may be connected to the circuit board for realizing photo shooting, video recording or feature identifying for human beings and objects. In some embodiments, the overall electronic device 100 may be of a columnar structure, shaped as a cylinder, a flattened cylinder, a polyhedron, and etc.

In the description of the present application, it needs be noted that unless otherwise explicitly specified or limited, the terms "installed", "connected", and "connection" should be construed broadly, for example, a fixed connection, a detachable connection, or integrally connected. These terms may be directed to a mechanical connection, and may also be directed to an electrical connection or communication. Moreover, these terms can be directed to "directly attached", "indirectly connected" through an intermediate medium, and may be directed to "internally communicated" with two components or the "interaction relationship" between two components. For persons of ordinary skill in the art, they can understand the specific meaning of the terms in the present application based on specific conditions.

Figure 3:
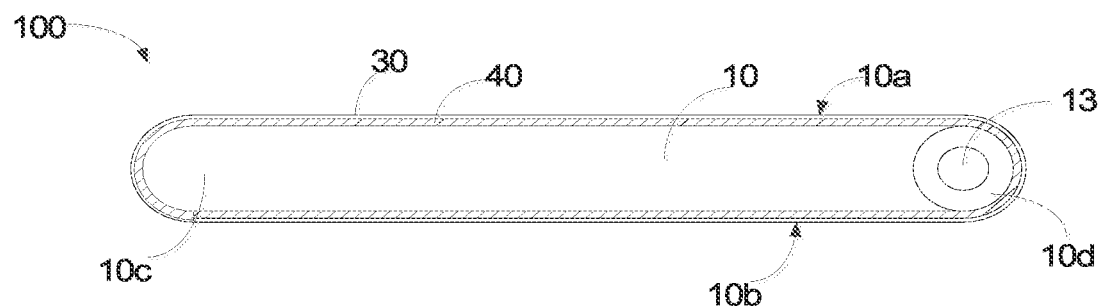
FIG. 3 is a bottom view of the electronic device provided in an embodiment of the present application, where a flexible display screen is retracted.
Figure 4:
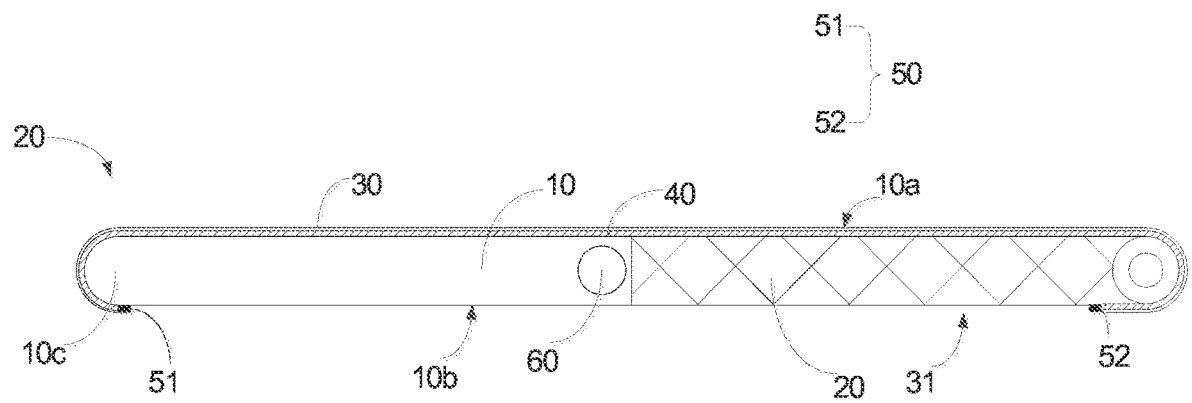
FIG. 4 is a bottom view of the electronic device provided in an embodiment of the present application, where the flexible display screen is extended.
Figure 5:
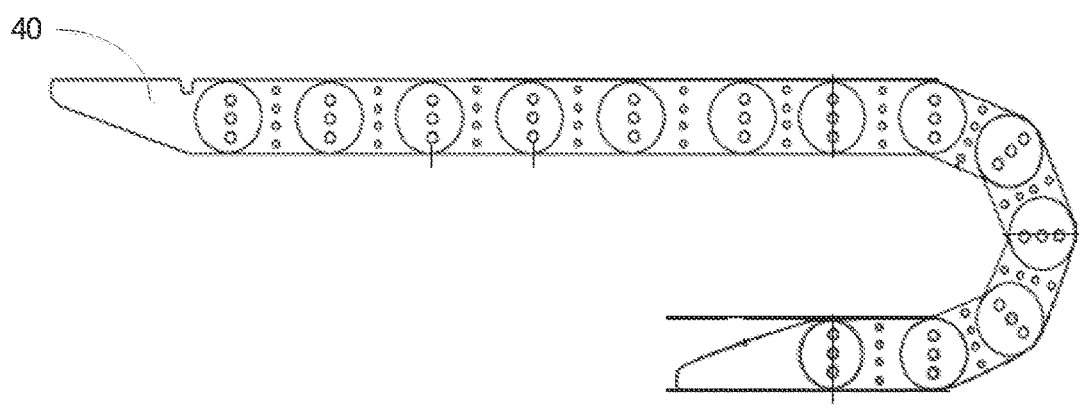
FIG. 5 is a structural schematic diagram showing a supporting track of an electronic device provided in an embodiment of the present application.

FIG. 3 is a bottom view of the electronic device provided in an embodiment of the present application, where a flexible display screen is retracted. FIG. 4 is a bottom view of the electronic device provided in an embodiment of the present application, where the flexible display screen is extended.

The electronic device 100 of the present application includes the housing 10, the guiding component 20 and the flexible display screen 30. The housing 10 has a first face 10a and a second face 10b that are disposed opposite to each other, and a first lateral portion 10c and a second lateral portion 10d that are disposed opposite to each other. The guiding component 20 is housed inside the housing 10, and the guiding component 20 is extendable for driving the second lateral portion 10d to extend or retract. The flexible display screen 30 is disposed on an external surface of the housing 10, and the flexible display screen 30 has an opening 31 at a side where the second face 10b is located. In response to driving by the guiding component 20 to extend the second lateral portion 10d, the flexible display screen 30 is split from the opening 31 and moves from the second face to the first face along the guiding component 20.

The housing 10 may be shaped as a cylinder, a cuboid, a polyhedron, and etc. That is, a cross-sectional area of the housing may be shaped as a circle, a rectangle, a square, a polygon, and etc. The shape of the cross-sectional area of the housing 10 is not specifically limited in the embodiment of the present application. To better illustrate the embodiment of the present application, the housing 10 is assumed to be a cuboid by default in the embodiment of the present application unless otherwise specified.

Specifically, the housing 10 has the first face 10a and the second face 10b that are disposed opposite to each other, and the first lateral portion 10c and the second lateral portion 10d that are disposed opposite to each other. The housing 10 further has a first edge portion 10e and a second edge portion 10f that are disposed opposite to each other. In the embodiment of the present application, the directions which the first edge portion 10e and the second edge portion 10f refer to, the first face 10a and the second face 10b refer to, and the first lateral portion 10c and the second lateral portion 10d refer to may be changeable. To better illustrate the embodiment of the present application, the first edge portion 10e usually refers to a top portion, the second edge portion 10f refers to a bottom portion of the body, the first lateral portion 10c usually refers to a left portion, and the second lateral portion 10d usually refers to a right portion, unless otherwise specified in the present application.

Specifically, the guiding component 20 is an extendable structure. For example, the guiding component 20 and the housing 10 are of a drawer-like structure. The guiding component 20 is extended from the housing 10, forming an extending state of the guiding component 20. The guiding component 20 is retracted back to the housing 10, forming a retracting state of the guiding component 20. Of course, the guiding component 20 may also be of any other types of extendable structures, which will not be described in detail in the embodiment of the present application.

Specifically, the flexible display screen 30 is disposed on the external surface of the housing 10, and the flexible display screen 30 has the opening 31 at a side where the second face 10b is located.

The flexible display screen 30 may be made using flexible material, and the flexible display screen 30 may be deformed. For example, the flexible display screen 30 may be bent or curved. The flexible display screen 30 may be housed in the housing 10. The flexible display screen 30 may be a component of a touch display that incorporating a conductive capacitive touch-sensitive electrode layer or other touch-sensitive components (for example, resistive touch-sensitive components, acoustic touch-sensitive components, pressure-based touch-sensitive components or light-based touch-sensitive components). Alternatively, it may be a touchless flexible display screen 30. Capacitive touch-sensitive electrodes may be formed by arrays of pads made of indium tin oxide, or arrays of other transparent conductive structures.

In response to driving by the guiding component 20 to extend the second lateral portion 10d, the flexible display screen 30 is split from the opening 31 and moves from the second face 10a to the first face 10b along the guiding component 20.

Specifically, the guiding component 20 may be extended manually, and in this manual way, the flexible display screen 30 moves from the second face 10b to the first face 10a along the guiding component 20. Of course, other driving ways may be adopted to move the flexible display screen 30 from the second face 10b to the first face 10a along the guiding component. Specific driving ways will not be detailed in the embodiment of the present application.

Please refer to FIGS. 1 to 5. A supporting track 40 is provided on the external surface of the housing 10, and the flexible display screen 30 is disposed on the external surface of the supporting track 40. In response to driving by the guiding component 20 to extend the second lateral portion 10d, the supporting track 40 moves and thereby makes the flexible display screen 30 move from the second face 10b to the first face 10a along the guiding component 20.

It needs to be noted that the flexible display screen 30 is disposed on the supporting track 40, and the supporting track 40 moves and thereby makes the flexible display screen 30 move from the second face 10b to the first face 10a along the guiding component 20. Cooperation between the supporting track 40 and the guiding component 20 may better support the stretched flexible display screen 30, making the stretched portion keep flat and unable to be bent upward or downward. Additionally, a plurality of slots may be provided on the supporting track 40. Cooperation between the slots and the guiding component 20 may realize clamping at multiple points. Clamping the supporting track 40 at different positions may make the flexible display screen 30 move at different distances. In this way, the electronic device 100 is provided with an ability to be conformed at various display sizes.

An extending state is formed after the guiding component 20 is extended from the housing 10.

It needs to be noted that the guiding component 20 may be an extendable structure. For example, the guiding component 20 and the housing 10 are of a drawer-like structure. The guiding component 20 is extended from the housing 10, forming an extending state of the guiding component 20. The guiding component 20 is retracted back to the housing 10, forming a retracting state of the guiding component 20. Of course, the guiding component 20 may also be of any other types of extendable structures, which will not be described in detail in the embodiment of the present application.

The guiding component 20 includes a first connecting portion 21, a second connecting portion 22 and a connecting board 23, and the connecting board 23 is connected to the first connecting portion 21 and the second connecting portion 22.

A guiding slot 24 is provided on the first connecting portion 21 and the second connecting portion 22, and the supporting track 40 is extended or retracted along the guiding slot 24.

It needs to be noted that the guiding slot 24 may be formed on the first connecting portion 21 and the second connecting portion 22, and the supporting track 40 is extendable along the guiding slot 24. Extending along the guiding slot 24 can make sure that the supporting track 40 is not easy to depart from the electronic device 100 and it is smoother in the extending or the retracting.

A splitting gap is provided on the supporting track 40, the splitting gap corresponds to the opening 31, and the supporting track 40 is splitable through the opening.

It needs to be noted that in response to the guiding component 20 extended, the supporting track 40 is split along the splitting gap and the supporting track 40 moves and thereby makes the flexible display screen 30 move from the second face 10b to the first face 10a along the guiding component 20.

Connecting members 50 are provided on the supporting track 40 at two sides of the splitting gap, and the connecting members 50 are connected to each other in response to the guiding component 20 retracted.

It needs to be noted that in response to the guiding component 20 extended, the connecting members 50 are released, the supporting track 40 is split along the splitting gap, and the supporting track 40 moves and thereby makes the flexible display screen 30 move from the second face 10b to the first face 10a along the guiding component 20; in response to the guiding component retracted, the supporting track 40 moves and thereby makes the flexible display screen 30 retract back to its original position, and the connecting members 50 make two ends of the supporting track 40 connected to each other. In this way, it can make sure that the supporting track 40 will not be split when the guiding component 20 is retracted, thereby making sure that the flexible display screen 30 of the electronic device 100 operates stably when retracted.

The connecting members 50 include a first magnetic element 51 and a second magnetic element 52. The first magnetic element 51 is disposed on the supporting track 40 at one side of the splitting gap and the second magnetic element 52 is disposed on the supporting track 40 at the other side of the splitting gap.

It needs to be noted that attraction and repulsion between the first magnetic element 51 and the second magnetic element 52 will make the supporting track 40 be joined and split, respectively. In this way, it can make sure that the supporting track 40 will not be split when the guiding component 20 is retracted, thereby making sure that the flexible display screen 30 of the electronic device 100 operates stably when retracted.

The electronic device 100 further includes a driving mechanism, which is connected to the guiding component 20, and the driving mechanism drives the guiding component 20 to extend or retract.

It needs to be noted that the electronic device 100 further includes a processor 70, which is connected to the driving mechanism. Based on a control instruction, the processor 70 controls the movement of the driving mechanism such that the driving mechanism 60 drives the guiding component to move to extend or retract the flexible display screen.

It needs to be noted that the processor 70 may be a microprocessor. It can be understood that the processor 70 may be disposed on a circuit board.

The electronic device 100 includes an acoustic component, which is used to transmit or receive a sound signal. The acoustic device is connected to the processor, and the processor generates the control instruction according to the received sound signal. It can be understood that when the acoustic device receives a sound signal, the processor will match the received sound signal with a predetermined sound signal to obtain a matching result. If matched, a control instruction is generated, and the control instruction can be used to control the operation of the driving mechanism 60. It is very convenient to use this way of operation. In some occasions, the flexible display screen 30 is controlled by the source signal to be extended or retracted. It provides a convenient operation undoubtedly.

The electronic device 100 further includes a trigger button, which is connected to the processor. When a signal generated by the trigger button is transmitted to the processor, the control instruction is generated. It needs to be noted that the trigger button may be disposed on the housing. When the trigger button is pressed, the signal generated by the trigger button is transmitted to the processor, and then the processor generates the control instruction. Using this way to control the driving mechanism can quickly extend or retract the flexible display screen 30.

An accommodating hole 13 is disposed in the second lateral portion 10d, and the accommodating hole 13 is configured to accommodate a stylus.

It needs to be noted that the accommodating hole 13 can be used to accommodate a stylus. In this way, there is an accommodating room that is for the stylus, and it is very convenient to accommodate the stylus. Of course, the accommodating hole may also be used to accommodate other components, such as a sensor. The components received in the accommodating hole will not be detailed in the embodiment of the present application.

The electronic device 100 may further include a memory, which can store data. For example, the memory stores the data to be processed by the processor, or the memory stores the data that have been processed by the processor.

The electronic device 100 may include a battery. The battery may be disposed inside the housing 10. The battery may be set as a cuboid and may also be set as a cylinder. The battery may be electrically connected to a mother board. The battery may supply power to the electronic device 100. In some embodiments, the mother board and the battery may be arranged in parallel inside the housing 10.

In the electronic device provided in the embodiment of the present application, the electronic device 100 of the present application includes the housing 10, the guiding component 20 and the flexible display screen 30. The housing 10 has a first face 10a and a second face 10b that are disposed opposite to each other, and a first lateral portion 10c and a second lateral portion 10d that are disposed opposite to each other. The guiding component 20 is housed inside the housing 10, and the guiding component 20 is extendable for driving the second lateral portion 10d to extend or retract. The flexible display screen 30 is disposed on an external surface of the housing 10, and the flexible display screen 30 has an opening 31 at a side where the second face 10b is located. In response to driving by the guiding component 20 to extend the second lateral portion 10d, the flexible display screen 30 is split from the opening 31 and moves from the second face to the first face along the guiding component 20. In response to the guiding component 20 retracted, the flexible display screen 30 is on the external surface of the housing 10 and it is achievable double-side displaying. In response to the guiding component 20 extended, a part of the flexible display screen 30 on the second face 10b of the housing 10 moves to the first face 10a of the housing 10, thereby realizing a change from double-side displaying to single-side displaying for the electronic device 100 and changing the display profile of the electronic device 100.

Referring to FIG. 6, an embodiment of the present application provides a method for controlling an electronic device, which is applied to the electronic device. The electronic device includes a housing, a guiding component, a flexible display screen, a supporting track and a processor. The housing has a first face and a second face that are disposed opposite to each other, and a first lateral portion and a second lateral portion that are disposed opposite to each other. The guiding component is housed inside the housing, and the guiding component is extendable for driving the second lateral portion to extend or retract. The flexible display screen is disposed on an external surface of the housing, and the flexible display screen has an opening at a side where the second face is located. The supporting track is disposed on the external surface of the housing, and the flexible display screen is disposed on the external surface of the supporting track. The processor executes the following steps.

Step 201: receiving a control instruction including a sliding operation.

It needs to be noted that the sliding operation includes sliding toward a predetermined direction from a predetermined position. Specifically, the way of operation is sliding toward a first direction such that the processor controls the guiding component to be extended and sliding toward a second direction such that the processor controls the guiding component to be retracted.

Step 202: based on the sliding operation, controlling the supporting track to move and thereby make the flexible display screen move from the second face to the first face along the guiding component.

The sliding operation includes sliding toward a predetermined direction from a predetermined position; and based on the sliding in a corresponding direction, obtaining the control instruction corresponding to the sliding of the corresponding direction.

The sliding toward the predetermined direction from the predetermined position includes sliding toward a first direction to obtain a first control instruction; sliding toward a second direction to obtain a second control instruction.

It needs to be noted that based on the first control instruction, the processor controls the guiding component to be extended after the sliding toward the first direction to obtain the first control instruction, and based on the second direction, the processor controls the guiding component to be retracted after the sliding toward the second direction to obtain the second control instruction.

The sliding operation further includes sliding for a distance toward a predetermined direction from a predetermined position.

It needs to be noted that the processor may be configured to control an extending length of the guiding component based on the sliding distance of the sliding operation. The sliding distance may be a distance perpendicular to an axial direction of the housing.

Hereinbefore, the electronic device 100 provided in the embodiment of the present application is introduced in detail, the principles and implementations of the present application are set forth herein with reference to specific examples, descriptions of the above embodiments are merely served to assist in understanding the technical solutions and essential ideas of the present application. In addition, persons of ordinary skill in the art can make variations and modifications to the present application in terms of the specific implementations and application scopes according to the ideas of the present application. Therefore, the content of specification shall not be construed as a limit to the present application.

What is claimed is:

1. An electronic device, comprising:
a housing, having a first face and a second face that are disposed opposite to each other, and a first lateral portion and a second lateral portion that are disposed opposite to each other;
a guiding component, housed inside the housing, wherein the guiding component is extendable for driving the second lateral portion to extend or retract;
a flexible display screen, disposed on an external surface of the housing, wherein the flexible display screen has an opening at a side where the second face is located;
a supporting track, disposed on the external surface of the housing, wherein the flexible display screen is disposed on the external surface of the supporting track, and in response to driving by the guiding component to extend the second lateral portion, the supporting track moves and thereby makes the flexible display screen move from the second face to the first face along the guiding component; and
a processor, electrically connected to the supporting track, wherein in response to driving by the guiding component to extend the second lateral portion, the flexible display screen is split from the opening, and the processor controls the supporting track to move and thereby make the flexible display screen move from the second face to the first face along the guiding component,
wherein a splitting gap is provided on the supporting track, the splitting gap corresponds to the opening, and the supporting track is splitable through the opening,
wherein connecting members are provided on the supporting track at two sides of the splitting gap, and the connecting members are connected to each other in response to the guiding component retracted.

2. The electronic device according to claim 1, wherein an extending state is formed after the guiding component is extended from the housing, the guiding component comprising a first connecting portion, a second connecting portion and a connecting board, and the connecting board is connected to the first connecting portion and the second connecting portion.

3. The electronic device according to claim 2, wherein a guiding slot is provided on the first connecting portion and the second connecting portion, and the supporting track is extended or retracted along the guiding slot.

4. The electronic device according to claim 1, wherein the connecting members comprise a first magnetic element and a second magnetic element, the first magnetic element is disposed on the supporting track at one side of the splitting gap, and the second magnetic element is disposed on the supporting track at the other side of the splitting gap.

5. An electronic device, comprising:
a housing, having a first face and a second face that are disposed opposite to each other, and a first lateral portion and a second lateral portion that are disposed opposite to each other;
a guiding component, housed inside the housing, wherein the guiding component is extendable for driving the second lateral portion to extend or retract;

a flexible display screen, disposed on an external surface of the housing, wherein the flexible display screen has an opening at a side where the second face is located; and a supporting track, disposed on the external surface of the housing, wherein the flexible display screen is disposed on the external surface of the supporting track, and in response to driving by the guiding component to extend the second lateral portion, the supporting track moves and thereby makes the flexible display screen move from the second face to the first face along the guiding component, wherein a splitting gap is provided on the supporting track, the splitting gap corresponds to the opening, and the supporting track is splitable through the opening, wherein connecting members are provided on the supporting track at two sides of the splitting gap, and the connecting members are connected to each other in response to the guiding component retracted.

6. The electronic device according to claim 5, wherein an extending state is formed after the guiding component is extended from the housing.

7. The electronic device according to claim 6, wherein the guiding component comprising a first connecting portion, a second connecting portion and a connecting board, and the connecting board is connected to the first connecting portion and the second connecting portion.

8. The electronic device according to claim 7, wherein a guiding slot is provided on the first connecting portion and the second connecting portion, and the supporting track is extended or retracted along the guiding slot.

9. The electronic device according to claim 5, wherein the connecting members comprise a first magnetic element and a second magnetic element, the first magnetic element is disposed on the supporting track at one side of the splitting gap, and the second magnetic element is disposed on the supporting track at the other side of the splitting gap.

10. The electronic device according to claim 5, further comprising a driving mechanism, connected to the guiding component, wherein the driving mechanism drives the guiding component to extend or retract.

11. The electronic device according to claim 5, wherein an accommodating hole is disposed in the second lateral portion, and the accommodating hole is configured to accommodate a stylus.

12. A method for controlling an electronic device, applied to the electronic device, which comprises a housing, a guiding component, a flexible display screen, a supporting track and a processor, wherein the housing has a first face and a second face that are disposed opposite to each other, and a first lateral portion and a second lateral portion that are disposed opposite to each other; the guiding component is housed inside the housing, and the guiding component is extendable for driving the second lateral portion to extend or retract; the flexible display screen is disposed on an external surface of the housing, and the flexible display screen has an opening at a side where the second face is located; the supporting track is disposed on the external surface of the housing, and the flexible display screen is disposed on the external surface of the supporting track; a splitting gap is provided on the supporting track, the splitting gap corresponds to the opening, and the supporting track is splitable through the opening; connecting members are provided on the supporting track at two sides of the splitting gap, and the connecting members are connected to each other in response to the guiding component retracted, wherein the processor executes the steps of:

receiving a control instruction comprising a sliding operation; and based on the sliding operation, controlling the supporting track to move and thereby make the flexible display screen move from the second face to the first face along the guiding component.

13. The method according to claim 12, wherein the sliding operation comprises:

sliding toward a predetermined direction from a predetermined position; and based on the sliding in a corresponding direction, obtaining the control instruction corresponding to the sliding of the corresponding direction.

14. The method according to claim 13, wherein the sliding toward the predetermined direction from the predetermined position comprises:

sliding toward a first direction to obtain a first control instruction; and sliding toward a second direction to obtain a second control instruction.

15. The method according to claim 12, wherein the sliding operation comprises:

sliding for a distance toward a predetermined direction from a predetermined position.

16. The method according to claim 12, wherein an extending state is formed after the guiding component is extended from the housing, the guiding component comprising a first connecting portion, a second connecting portion and a connecting board, and the connecting board is connected to the first connecting portion and the second connecting portion.

17. The method according to claim 16, wherein a guiding slot is provided on the first connecting portion and the second connecting portion, and the supporting track is extended or retracted along the guiding slot.

18. The method according to claim 12, wherein the connecting members comprise a first magnetic element and a second magnetic element, the first magnetic element is disposed on the supporting track at one side of the splitting gap, and the second magnetic element is disposed on the supporting track at the other side of the splitting gap.

* * * * *